United States Patent
Wen et al.

(10) Patent No.: US 11,913,726 B2
(45) Date of Patent: Feb. 27, 2024

(54) VAPOR CHAMBER HEATSINK ASSEMBLY

(71) Applicant: Cooler Master Co., Ltd., New Taipei (TW)

(72) Inventors: Yuanlong Wen, Huizhou (CN); Meiping Fan, Huizhou (CN); Shan yin Cheng, New Taipei (TW)

(73) Assignee: Cooler Master Co., Ltd., Taipei (TW)

( * ) Notice: Subject to any disclaimer, the term of this patent is extended or adjusted under 35 U.S.C. 154(b) by 0 days.

(21) Appl. No.: 17/130,036

(22) Filed: Dec. 22, 2020

(65) Prior Publication Data

US 2022/0128316 A1 Apr. 28, 2022

(30) Foreign Application Priority Data

Oct. 22, 2020 (CN) .......................... 202011138603.X

(51) Int. Cl.
*F28D 15/04* (2006.01)
*F28D 15/02* (2006.01)
(Continued)

(52) U.S. Cl.
CPC ....... *F28D 15/046* (2013.01); *F28D 15/0233* (2013.01); *F28F 3/06* (2013.01); *F28D 2021/0029* (2013.01)

(58) Field of Classification Search
CPC ............ F28D 15/0266; F28D 15/0233; F28D 2021/0029; F28D 15/046; F28D 15/02; F28D 15/04; F28D 2021/0028; F28F 1/10; F28F 2280/06; F28F 2275/20; F28F 2275/14; F28F 2280/02; F28F 2215/04;
(Continued)

(56) References Cited

U.S. PATENT DOCUMENTS

2002/0139515 A1* 10/2002 Azar ................... H01L 23/3672
257/E23.099
2006/0005950 A1* 1/2006 Wang .................. F28D 15/0233
257/E23.088
(Continued)

FOREIGN PATENT DOCUMENTS

CN 105140194 * 12/2015 ............... F28F 3/02
CN 107484386 A 12/2017
(Continued)

*Primary Examiner* — Harry E Arant

(57) ABSTRACT

A vapor chamber heatsink assembly, under vacuum, having a working fluid therein, comprising a plurality of heatsink fins and a vapor chamber is provided. The vapor chamber and the plurality of heatsink fins each comprise a plurality of obstructers defining a plurality of braided channels therein. Thus, the condenser regions of the vapor chamber are expanded to the plurality of heatsink fins. When heat from a greater temperature heat source and a lower temperature heat source is applied to the vapor chamber, via the plurality of obstructers and braided channels, the working fluid and liquid vapor travel therethrough, providing an effective phase change mechanism to the greater temperature heat source, while concurrently, hindering agglomeration of working fluid thereto. An effective phase change mechanism is also concurrently provided to the lower temperature heat source due to the non-agglomeration of working fluid to the greater temperature heat source.

14 Claims, 8 Drawing Sheets

(51) Int. Cl.
*F28F 3/06* (2006.01)
*F28D 21/00* (2006.01)

(58) Field of Classification Search
CPC ...... F28F 2215/06; F28F 2215/08; F28F 3/06;
F28F 9/26; F28F 3/14; H01L 23/427;
H01L 23/3672
See application file for complete search history.

(56) References Cited

U.S. PATENT DOCUMENTS

| | | |
|---|---|---|
| 2007/0272399 A1 | 11/2007 | Nitta et al. |
| 2008/0043438 A1 | 2/2008 | Refai-Ahmed |
| 2009/0178782 A1* | 7/2009 | Guyon .................... B23P 15/26 |
| | | 165/80.3 |
| 2013/0340978 A1* | 12/2013 | Agostini ............ F28D 15/0275 |
| | | 165/104.21 |
| 2016/0123637 A1* | 5/2016 | Moreno .................. F25B 39/02 |
| | | 62/516 |
| 2017/0049006 A1* | 2/2017 | McLaughlin ......... H01L 23/427 |
| 2019/0132992 A1* | 5/2019 | Farshchian ............. F28D 15/04 |
| 2019/0353430 A1 | 11/2019 | Narasimhan et al. |
| 2020/0232717 A1* | 7/2020 | Kao .......................... F28F 3/06 |

FOREIGN PATENT DOCUMENTS

| | | | | |
|---|---|---|---|---|
| CN | 109341401 | * | 2/2019 | ............. F28D 15/02 |
| CN | 110351991 A | | 10/2019 | |
| CN | 111366018 | * | 7/2020 | ......... F28D 15/0266 |
| TW | I620910 B | | 4/2018 | |
| WO | WO201815592 | * | 8/2018 | ......... H01L 21/4871 |

* cited by examiner

VAPOR CHAMBER HEATSINK ASSEMBLY

RELATED APPLICATIONS

The application claims the benefit of priority to China application no. 202011138603.X, filed on Oct. 22, 2020, of which is incorporated herein by reference in its entirety.

TECHNICAL FIELD

Example embodiments relate generally to the field of heat transfer and, more particularly, to vapor chamber heatsink assemblies.

BACKGROUND

During operation of electric and electronic elements, devices and systems, the heat generated thereby must be dissipated quickly and efficiently to keep operating temperature within manufacturer recommended ranges, under, at times, challenging operating conditions. As these elements, devices and systems increase in functionality and applicability, so does the power requirements thereof, this in turn increases cooling requirements.

Several techniques have been developed for extracting heat from electric and electronic elements, devices and systems. One such technique is an air-cooling system, wherein a heatsink assembly is in thermal contact with the elements, devices or systems, transporting heat away therefrom, and then air flowing over the heatsink assembly removes heat therefrom. One type of heatsink assembly is a vapor chamber.

A vapor chamber is a type of planar heat pipe, employed individually, or in conjunction with other thermal management systems such as heatsink fins, as an example, for heat spreading. Vapor chambers are vacuum containers that carry heat by evaporation of a working fluid, which is spread by a vapor flow filling the vacuum. The vapor flow eventually condenses over cooler surfaces, and, as a result, the heat is distributed from an evaporation surface (heat flux source interface) to a condensation surface (cooling surface). Thereafter, condensed fluid flows back toward the evaporation surface. A wick structure is often used to facilitate the flow of the condensed fluid back to the evaporation surface keeping it wet for large heat fluxes.

For vapor chambers employed in conjunction with heatsink fins, a plurality of heatsink fins extends from a surface of the vapor chamber. The plurality of heatsink fins increases the rate of convective heat transfer to or from an environment of the vapor chamber heatsink assembly, by increasing the surface area of the heat flux source interface. Heat is transferred from the heat source to the vapor chamber, the vapor chamber to the plurality of heatsink fins and the environment, and the plurality of heatsink fins to the environment.

Generally, the thermal performance of the plurality of heat sink fins is dependent on the effectiveness to transfer heat. Thus, shape, thickness, material, and enhancements of the plurality of fins all contribute to the thermal performance thereof. An increase in the amount of the plurality of fins for a given attachment area increases surface area, but, may hinder the average amount of heat transferred from each square centimeter of the surface area by restricting airflow. Also, an increase in the height of the fins for a given attachment area also increases surface area, but, may decrease fin efficiency and increase mass, weight and costs. Increasing the amount and size of the plurality of fins may increase surface area, but contrarily, decrease overall thermal performance. This is further exacerbated when only natural convection is available. Furthermore, for vaper chambers to effectively spread heat via the phase change (liquid-vapor-liquid) mechanism, the area of the cooling surfaces should be larger than the heat flux source interface surfaces, the design of the vapor chambers should hinder deformation and leakage and heat-transmitting efficiency of the vapor chamber should be at a highest. This becomes more difficult to accomplish as the amount of heat flux source interfaces, having a distance therebetween, increase; thus, requiring the dimensions of the vapor chamber to increase. As the dimensions of the vapor chamber increases, so does the dimensions of the plurality of heatsink fins and correspondingly, the weight on the surface of the vapor chamber. Additionally, when there is more than one heat flux source interface, leakage and dry-out occurs, when the temperature of one of the heat flux sources is greater than the temperature of another heat flux source, causing the working fluid to agglomerate closer to the heat flux source with the higher temperature. Thus, dry-out occurs near the lower temperature heat flux source interface, causing the corresponding electric and/or electronic elements, devices and/or systems to overheat, fail or become damaged.

SUMMARY

In an embodiment, a vapor chamber heatsink assembly, under vacuum, having a working fluid therein, comprising a vapor chamber and a plurality of heatsink fins mounted thereon. The plurality of heatsink fins, each, have a first metal sheet connected to a second metal sheet defining a fin tip, a fin base opposite the fin tip and an enhancement portion between the fin tip and fin base. The enhancement portion has a plurality of airflow through holes therethrough, defining a plurality of fin obstructers forming a plurality of fin braided channels therearound in direct or indirect communication thereamong. The plurality of airflow through holes force airflow to flow from a second direction perpendicular to the airflow flowing across the surfaces between each neighboring heat exchanger fin from a first direction, agitating airflow, creating turbulent airflow, thus, eliminating dead air between each heat exchanger fin. The fin base has at least two connection channels extending therethrough, the at least two connection channels are in direct or indirect communication with the plurality of fin braided channels. The vapor chamber has an upper casing and a lower casing. The upper casing comprises a mounting surface and an upper chamber surface opposite thereto. The upper casing has a plurality of mounting tracks extending therefrom, each having at least two receiving channels therethrough. The lower casing comprises a lower chamber surface and a contact surface, opposite thereto. The upper and lower chamber surfaces form a plurality of vapor obstructers defining a plurality of vapor braided channels therearound in direct or indirect communication thereamong.

The fin base and each of the at least two connection channels are mounted to the plurality of mounting tracks and at least two receiving channels, respectively. The first metal sheet is tightly connected to the second metal sheet, the upper chamber surface is tightly connected to the lower chamber surface liquid, and the plurality of heatsink fins is liquid tight connected to the vapor chamber, whereby the working fluid travels through the plurality of vapor braided channels and the plurality of fin braided channels unobstructed.

In some embodiments the vapor chamber heat assembly further comprises a first heat source and a second heat source, wherein the first and second heat sources are mounted to the contact surface of the lower casing, and at least one of the plurality of vapor obstructers of the upper and lower chamber surfaces is between the first and second heat sources. In some embodiments, the vapor chamber heat assembly further comprises a first heat source, a second heat source, and at least an additional heat source, wherein the at least an additional heat source is mounted to the contact surface of the lower casing. In some embodiments, the power requirement and maximum operating temperature allowance of the first heat source is less than the power requirement and maximum operating temperature allowance of the second heat source, whereby, during operation, the working fluid travels through the plurality of vapor braided channels, at least two connection channels, and the plurality of fin braided channels, respectively, while concurrently, being hindered to agglomerate to the second heat source via the at least one of the plurality of vapor obstructers therebetween. Thus, an effective phase change (liquid-vapor-liquid) mechanism to the lesser power and operating temperature first heat source is concurrently provided, in at least two opposing directions of the plurality of vapor braided channels directions, mitigating dry-out from occurring which may cause corresponding electric and/or electronic elements, devices and/or systems to overheat, fail or be damaged.

In some embodiments, the shape of each of the plurality of vapor obstructers is a four-sided shape, and each is separated by the plurality of vapor braided channels or at least a perimeter side of the vapor chamber.

In an alternative embodiment, the shape of each of the plurality of vapor obstructers is a four-sided shape, and each is separated by coinciding plurality of braided channels of neighboring plurality of vapor obstructers or at least a perimeter side of the vapor chamber, whereby at least one corner of each of the plurality of vapor obstructers define a corner of a cross-section of the plurality of braided channels.

In another alternative embodiment, the plurality of vapor obstructers comprises at least four sides, and each is separated by at least one of the plurality of vapor braided channels. The plurality of vapor braided channels in the another alternative embodiment is interconnected forming directed channels having at least one curved flow path change. In some embodiments, the plurality of braided channels comprises nine curved flow path changes.

In some embodiments, the amount of the plurality of vapor obstructers is between five and thirty, inclusive. In some embodiments, the amount of the plurality of vapor obstructers is greater than thirty.

In some embodiments, the shape of each of the plurality of airflow through holes is an elliptical shape, and each is separated by the plurality of fin braided channels or at least a fin perimeter side of the plurality of heatsink fins. In some embodiments, the pitch of the plurality of airflow through holes is a staggered pitch, and each is separated by the plurality of fin braided channels or at least a fin perimeter side of the plurality of heatsink fins. In some embodiments, the amount of the plurality of airflow through holes is between one to eighty, inclusive. In some embodiments, the amount of the plurality of airflow through holes is greater than eighty. The staggered pitch of the plurality of airflow through holes increases the creation of non-equilibrium pressure conditions within the plurality of fin braided channels, strengthening the self-sustaining turbulent driving forces therein.

In some embodiments, a side of each of the plurality of vapor braided channels opposite the contact surface of the lower chamber surface comprises a wick structure thereon, respectively. In some embodiments, a side of each of the plurality of fin braided channels opposite an outside surface of the plurality of heatsink fins comprises a wick structure thereon, respectively. In some embodiments, the wick structure comprises at least one of a porous polymer wick structure, micro groove wick structure, metal mesh wick structure, sintered powder wick structure or sintered ceramic powder wick structure, or any combination of the foregoing.

In some embodiments, each of the plurality of heatsink fins is mounted to the upper casing at the plurality of mounting tracks via brazing, respectively. In some of the embodiments, the plurality of fin braided channels is formed by inflating.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of vapor chamber heatsink assembly systems and methods incorporating aspects of the presently disclosed principles are illustrated by way of example, and not by way of limitation.

DETAILED DESCRIPTION

The following describes various principles related to heatsink assembly systems and methods by way of reference to specific examples of vapor chambers and heatsink fins including specific arrangements and examples of metal sheets, casings, braided channels, and obstructers embodying innovative concepts. More particularly, but not exclusively, such innovative principles are described in relation to selected examples of vapor chambers, heatsink fins, braided channels, obstructers, and airflow through hole systems and methods and well-known functions or constructions are not described in detail for purposes of succinctness and clarity. Nonetheless, one or more of the disclosed principles can be incorporated in various other embodiments of vapor chambers, heatsink fins, braided channels, obstructers, and airflow through hole systems and methods to achieve any of a variety of desired outcomes, characteristics, and/or performance criteria.

Thus, vapor chambers, heatsink fins, braided channels, obstructers, and airflow through hole systems and methods having attributes that are different from those specific examples discussed herein can embody one or more of the innovative principles, and can be used in applications not described herein in detail. Accordingly, embodiments of vapor chambers, heatsink fins, braided channels, obstructers, and airflow through hole systems and methods not described herein in detail also fall within the scope of this disclosure, as will be appreciated by those of ordinary skill in the relevant art following a review of this disclosure.

Example embodiments as disclosed herein are directed to vapor chamber heatsink assemblies, under vacuum, and having a working fluid therein. In an embodiment, a vapor chamber heatsink assembly, under vacuum, having a working fluid therein, comprising a plurality of heatsink fins and a vapor chamber is provided. The vapor chamber and the plurality of heatsink fins each comprise a plurality of obstructers defining a plurality of braided channels therein. Thus, the condenser regions of the vapor chamber are expanded to the plurality of heatsink fins. When heat from a greater temperature heat source and a lower temperature heat source is applied to the vapor chamber, via the plurality of obstructers and braided channels, the working fluid and liquid vapor travel therethrough, providing an effective phase change mechanism to the greater temperature heat source, while concurrently, hindering agglomeration of working fluid thereto. An effective phase change mechanism is also concurrently provided to the lower temperature heat source due to the non-agglomeration of working fluid to the greater temperature heat source.

Figure 1A:
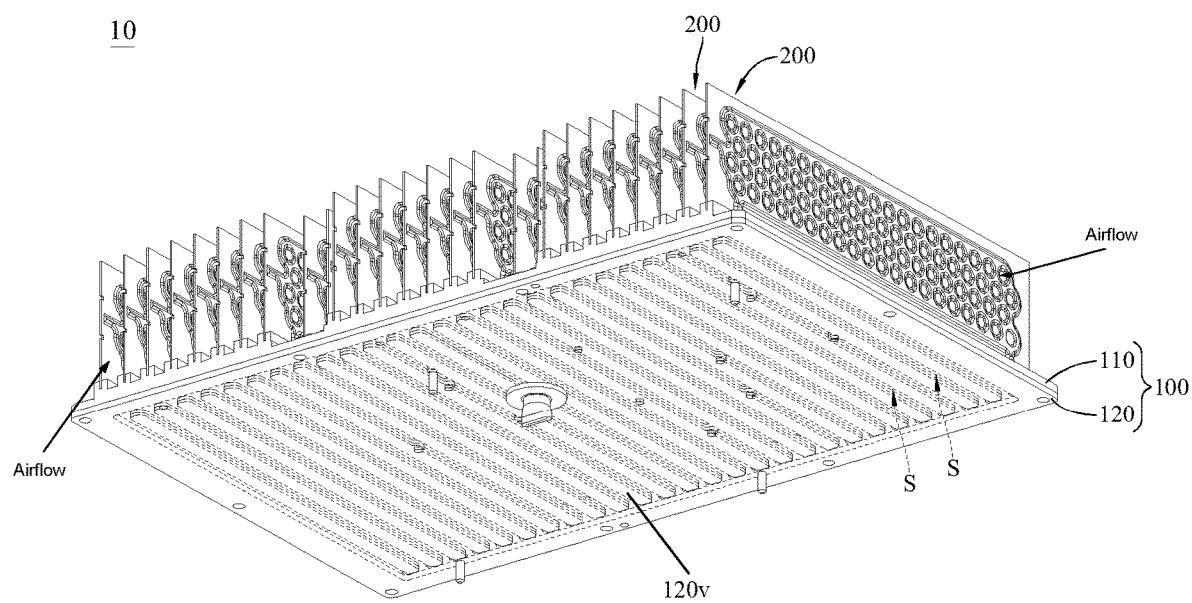
FIG. 1A is schematic perspective third view of a vapor chamber and a plurality of heatsink fins of a vapor chamber heatsink assembly, according to an example embodiment.
Figure 1B:
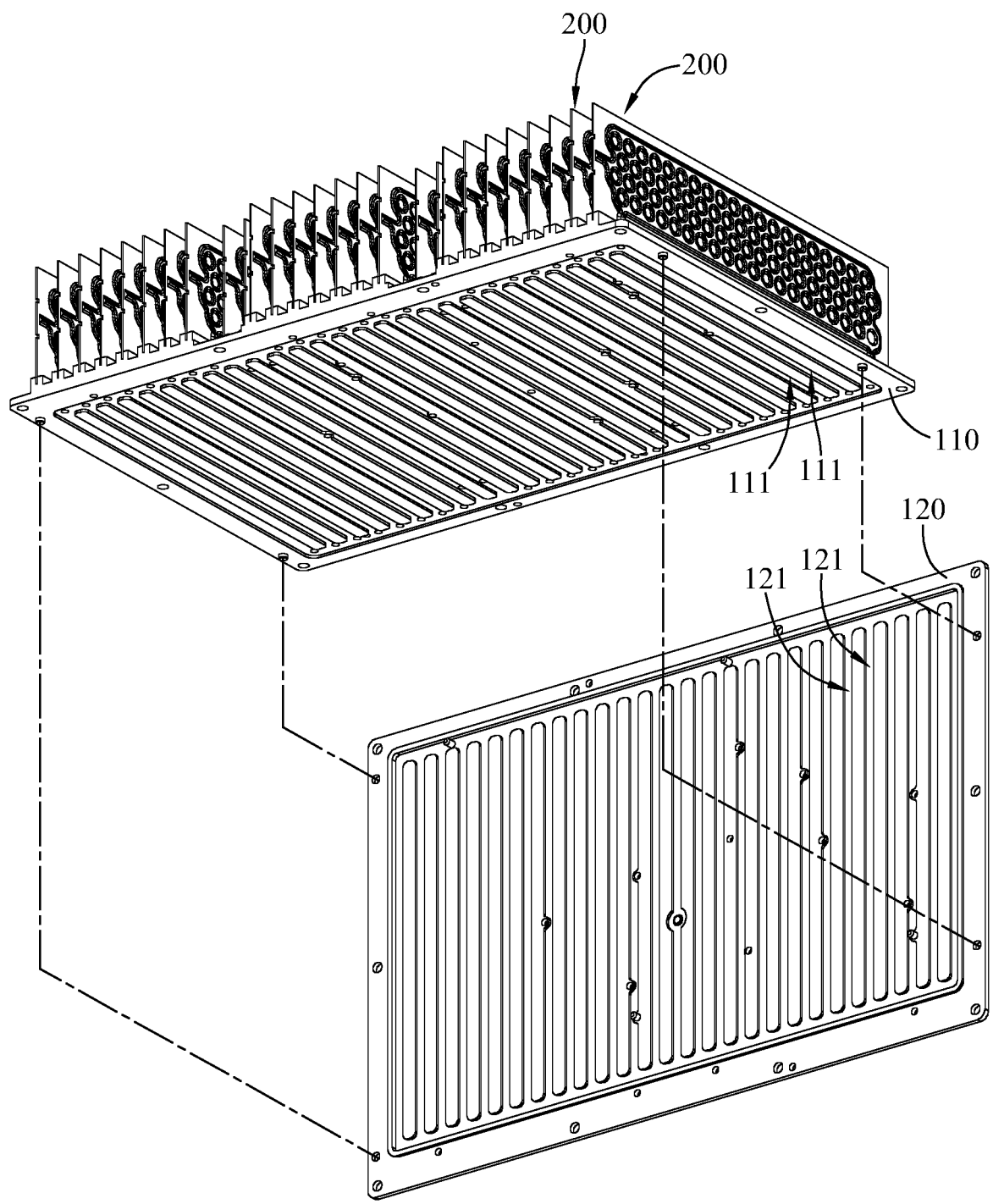
FIG. 1B is a schematic exploded view of the vapor chamber of the vapor chamber heatsink assembly of FIG. 1A, according to an example embodiment.
Figure 1C:
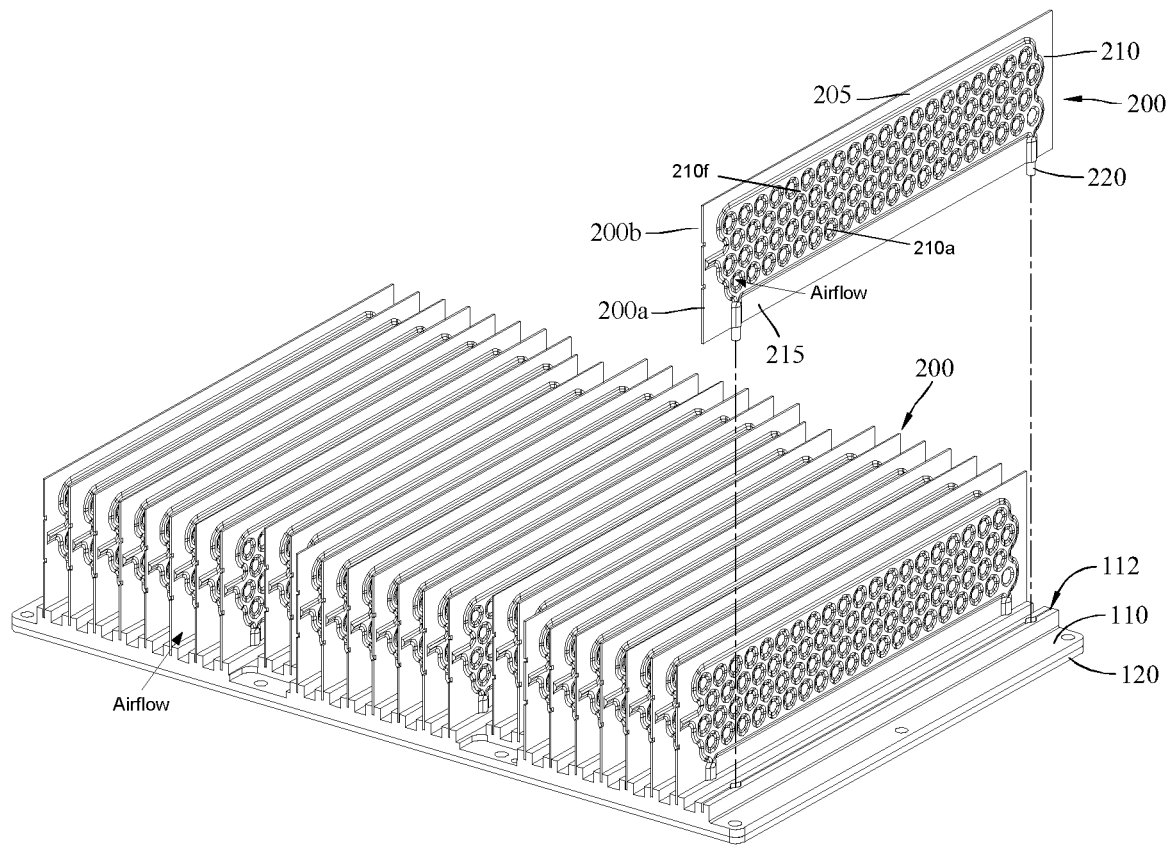
FIG. 1C is a schematic exploded view of the plurality of heatsink fins of the vapor chamber heatsink assembly of FIG. 1A, according to an example embodiment.

FIG. 1A is schematic perspective third view of a vapor chamber and a plurality of heatsink fins of a vapor chamber heatsink assembly, according to an example embodiment. FIG. 1B is a schematic exploded view of the vapor chamber of the vapor chamber heatsink assembly of FIG. 1A, according to an example embodiment. FIG. 1C is a schematic exploded view of the plurality of heatsink fins of the vapor chamber heatsink assembly of FIG. 1A, according to an example embodiment. The vapor chamber heatsink assembly may be employed to cool at least one of an electric and/or electronic element, device and/or system. Referring to FIGS. 1A to 1C, the vapor chamber heatsink assembly 10 comprises a vapor chamber 100 and a plurality of heatsink fins 200 mounted thereon. The plurality of heatsink fins 200, each, have a first metal sheet 200a connected to a second metal sheet 200b defining a fin tip 205, a fin base 215 opposite the fin tip 205 and an enhancement portion 210 between the fin tip 205 and fin base 215. The enhancement portion 210 has a plurality of airflow through holes 210a therethrough, defining a plurality of fin obstructers forming a plurality of fin braided channels 210f, C therearound in direct or indirect communication thereamong. The plurality of airflow through holes 210a force airflow to flow from a second direction perpendicular to the airflow flowing across the surfaces between each neighboring plurality of heatsink fins 200 from a first direction, agitating airflow, creating turbulent airflow, thus, eliminating dead air between each plurality of heatsink fins 200. The fin base 215 has at least two connection channels 220 extending therethrough. The at least two connection channels 220 are in direct or indirect communication with the plurality of fin braided channels 210f, C. The vapor chamber 100 has an upper casing 110 and a lower casing 120. The upper casing 110 comprises a mounting surface and an upper chamber surface opposite thereto. The upper casing 110 has a plurality of mounting tracks 112 extending therefrom, each having at least two receiving channels 112r therethrough. The lower casing 120 comprises a lower chamber surface and a contact surface, opposite thereto. The upper and lower chamber surfaces form a plurality of vapor obstructers 120v defining a plurality of vapor braided channels 111 and 121, S therearound in direct or indirect communication thereamong.

The fin base 215 and each of the at least two connection channels 220 are mounted to the plurality of mounting tracks 112 and at least two receiving channels 112r, respectively. The first metal sheet 200a is tightly connected to the second metal sheet 200b, the upper chamber surface is tightly connected to the lower chamber surface, and the plurality of heatsink fins 200 is liquid tight connected to the vapor chamber 100, whereby the working fluid travels through the plurality of vapor braided channels 111 and 121, S and the plurality of fin braided channels 210f, C unobstructed.

In some embodiments the vapor chamber heatsink assembly further comprises a first heat source (not shown) and a second heat source (not shown), wherein the first and second heat sources are mounted to the contact surface of the lower casing 120, and at least one of the plurality of vapor obstructers 120v of the upper and lower chamber surfaces is between the first and second heat sources. In some embodiments, the vapor chamber heat assembly further comprises a first heat source, a second heat source, and at least an additional heat source (not shown), wherein the at least an additional heat source is mounted to the contact surface of the lower casing 120. In some embodiments, the power requirement and maximum operating temperature allowance of the first heat source is less than the power requirement and maximum operating temperature allowance of the second heat source, whereby, during operation, the working fluid travels through the plurality of vapor braided channels 111 and 121, S, at least two connection channels 220, and the plurality of fin braided channels 210f, C respectively, while concurrently, being hindered to agglomerate to the second heat source via the at least one of the plurality of vapor obstructers 120v therebetween. Thus, an effective phase change (liquid-vapor-liquid) mechanism to the lesser power and operating temperature first heat source is concurrently provided, in at least two opposing directions of the plurality of vapor braided channels 111 and 121, S directions, mitigating dry-out from occurring which may cause corresponding electric and/or electronic elements, devices and/or systems to overheat, fail or be damaged.

In some embodiments, the shape of each of the plurality of vapor obstructers 120v is a four-sided shape, and each is separated by the plurality of vapor braided channels 111 and 121, S or at least a perimeter side of the vapor chamber 100.

Figure 2:
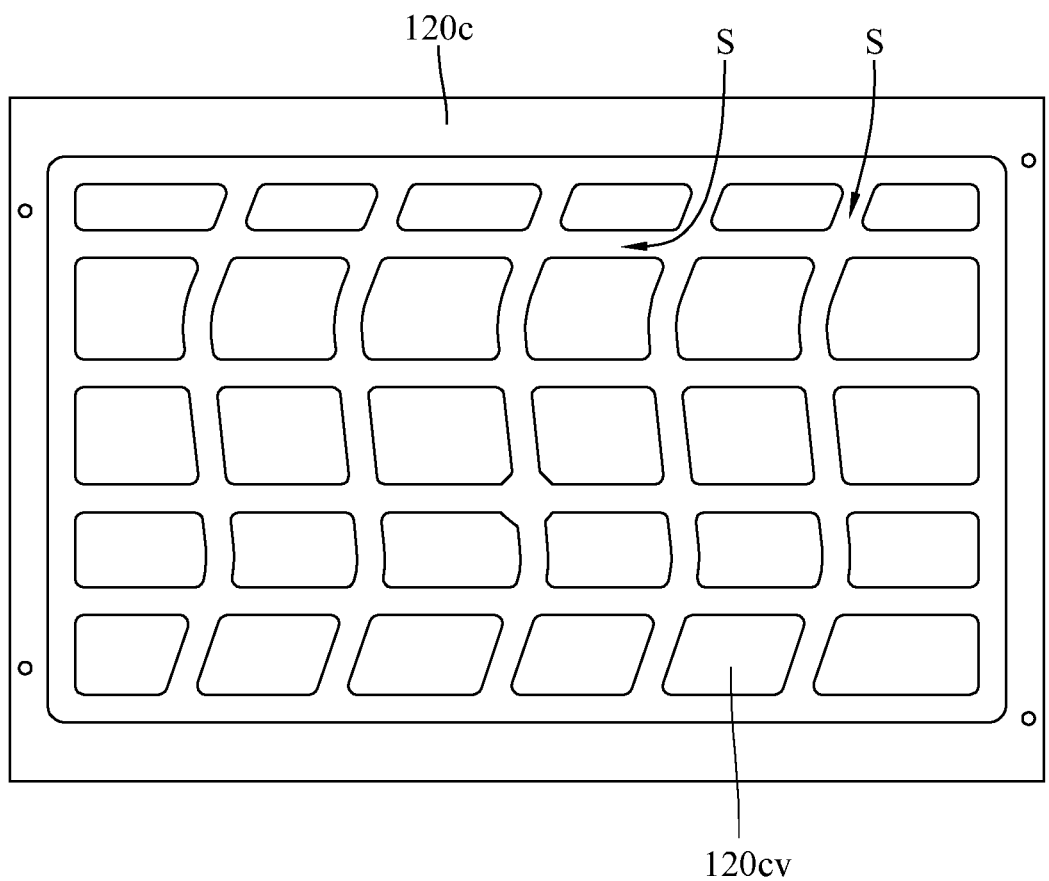
FIG. 2 is schematic perspective fifth view of a lower casing of an alternative vapor chamber heatsink assembly, according to an example embodiment.

Those of ordinary skill in the relevant art may readily appreciate that the shape and dimensions of the plurality of obstructers forming the plurality of vapor braided channels may be varied, forming the plurality of vapor braided channels in a plurality of multiple braid bars and/or a funnel-like and/or winding shape, and/or any combination thereof, depending upon application and design requirements and the embodiments are not limited thereto. As long as the plurality of vapor braided channels is in direct or indirect communication thereamong and the working fluid and liquid vapor slugs/bubbles travel through the plurality of vapor braided channels and the plurality of fin braided channels in an unobstructed manner, providing the effective phase change (liquid-vapor-liquid) mechanism. FIG. 2 is schematic perspective fifth view of a lower casing of an alternative vapor chamber heatsink assembly, according to an example embodiment. Referring to FIG. 2, and referring to FIGS. 1A to 1C, in an alternative embodiment, the shape of each of the plurality of vapor obstructers 120cv is a four-sided shape having a flowing pitch, and each is separated by coinciding plurality of vapor braided channels 111c and 121c, S of neighboring plurality of vapor obstructers 120cv or at least a perimeter side of the vapor chamber 100c, whereby at least one corner of each of the plurality of vapor obstructers 120v define a corner of a cross-section of the plurality of braided channels.

Note that other features and principles of the alternative vapor chamber heatsink assembly 10c is generally the same as and described in detail in the embodiments of the vapor chamber heatsink assembly 10 above, and for sake of brevity, will not repeated hereafter.

Figure 3:
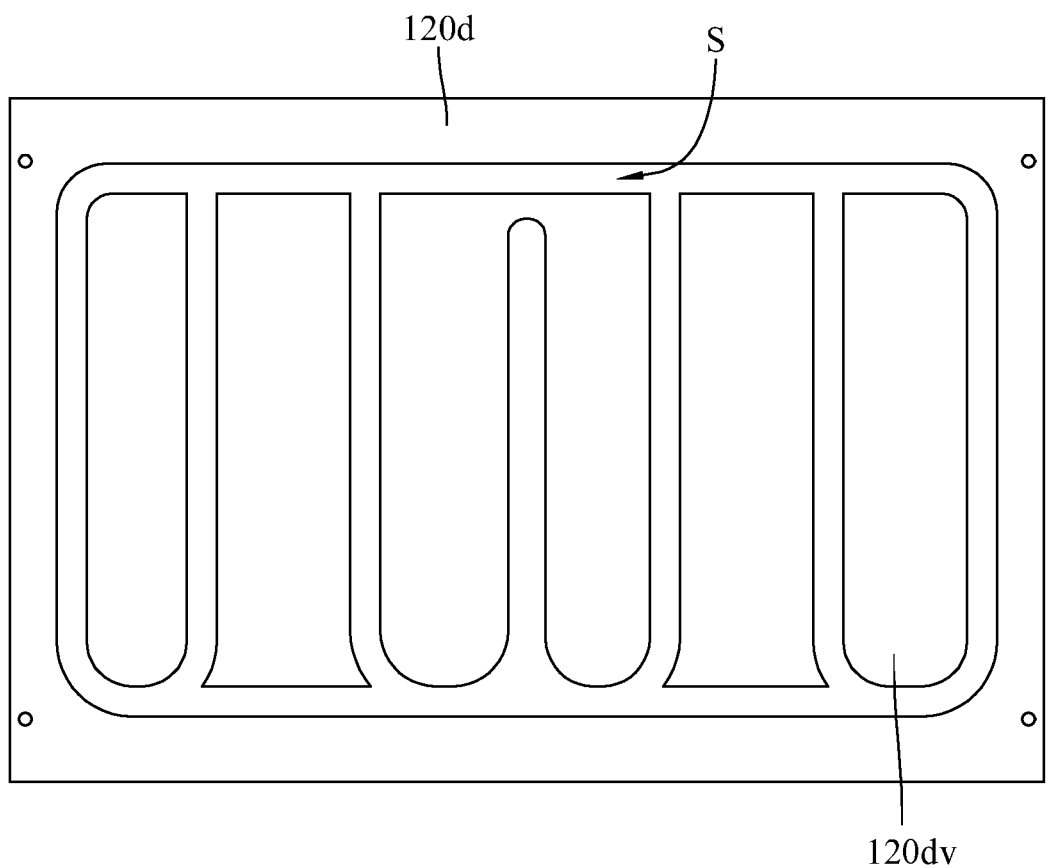
FIG. 3 is schematic perspective fifth view of a lower casing of another alternative vapor chamber heatsink assembly, according to an example embodiment.

FIG. 3 is schematic perspective fifth view of a lower casing of another alternative vapor chamber heatsink assembly, according to an example embodiment. Referring to FIG. 3, and referring to FIGS. 1A to 1C, in another alternative embodiment, the plurality of vapor obstructers 120dv comprises at least four sides, and each is separated by at least one of the plurality of vapor braided channels 111d and 121d, S. The plurality of vapor braided channels 111d and 121d, S in the another alternative embodiment is interconnected forming directed channels having at least one curved flow path change. In some embodiments, the plurality of vapor braided channels 111d and 121d, S comprises nine curved flow path changes.

Note that other features and principles of the another alternative vapor chamber heatsink assembly 10d is generally the same as and described in detail in the embodiments of the vapor chamber heatsink assembly 10 above, and for sake of brevity, will not repeated hereafter.

In some embodiments, the amount of the plurality of vapor obstructers 120v, 120cv, 120dv is between five and thirty, inclusive. In some embodiments, the amount of the plurality of vapor obstructers is greater than thirty.

In some embodiments, the shape of each of the plurality of airflow through holes 210a is an elliptical shape, and each is separated by the plurality of fin braided channels 210f, C or at least a fin perimeter side of the plurality of heatsink fins 200. In some embodiments, the pitch of the plurality of airflow through holes 210a is a staggered pitch, and each is separated by the plurality of fin braided channels 210f, C or at least a fin perimeter side of the plurality of heatsink fins 200. Those of ordinary skill in the relevant art may readily appreciate that the shape and pitches of the plurality of airflow through holes 210a may be varied, depending upon application and design requirements and the embodiments are not limited thereto.

In some embodiments, the amount of the plurality of airflow through holes 210a is between one to eighty, inclusive. In some embodiments, the amount of the plurality of airflow through holes is greater than eighty. The staggered pitch of the plurality of airflow through holes 210a increases the creation of non-equilibrium pressure conditions within the plurality of fin braided channels 210f, C strengthening the self-sustaining turbulent driving forces therein.

Dead air insulates heatsink fin surfaces which are facing one another and the base plate surfaces therebetween, keeping heat therein, thus, preventing heat dissipation and decreasing thermal performance of heat exchangers. This is further exacerbated when only natural convection is available and the distance between the heatsink fins is minimized. The plurality of airflow through holes 210a of the embodiments, force airflow to flow from a second direction perpendicular to the airflow flowing across the surfaces between each neighboring plurality of heatsink fins 200 along the length of each fin base 215 attached to each plurality of mounting tracks 112 from a first direction, agitating airflow, creating turbulent airflow, thus, eliminating dead air between each heatsink fin 100. By eliminating dead air via the plurality of airflow through holes 210a, the distance between the plurality of heatsink fins 200 may be minimized without sacrificing heat dissipation and thermal performance or the average amount of heat transferred from each square centimeter of surface area of the plurality of heatsink fins 200, even when only natural convection is available.

Figure 4:
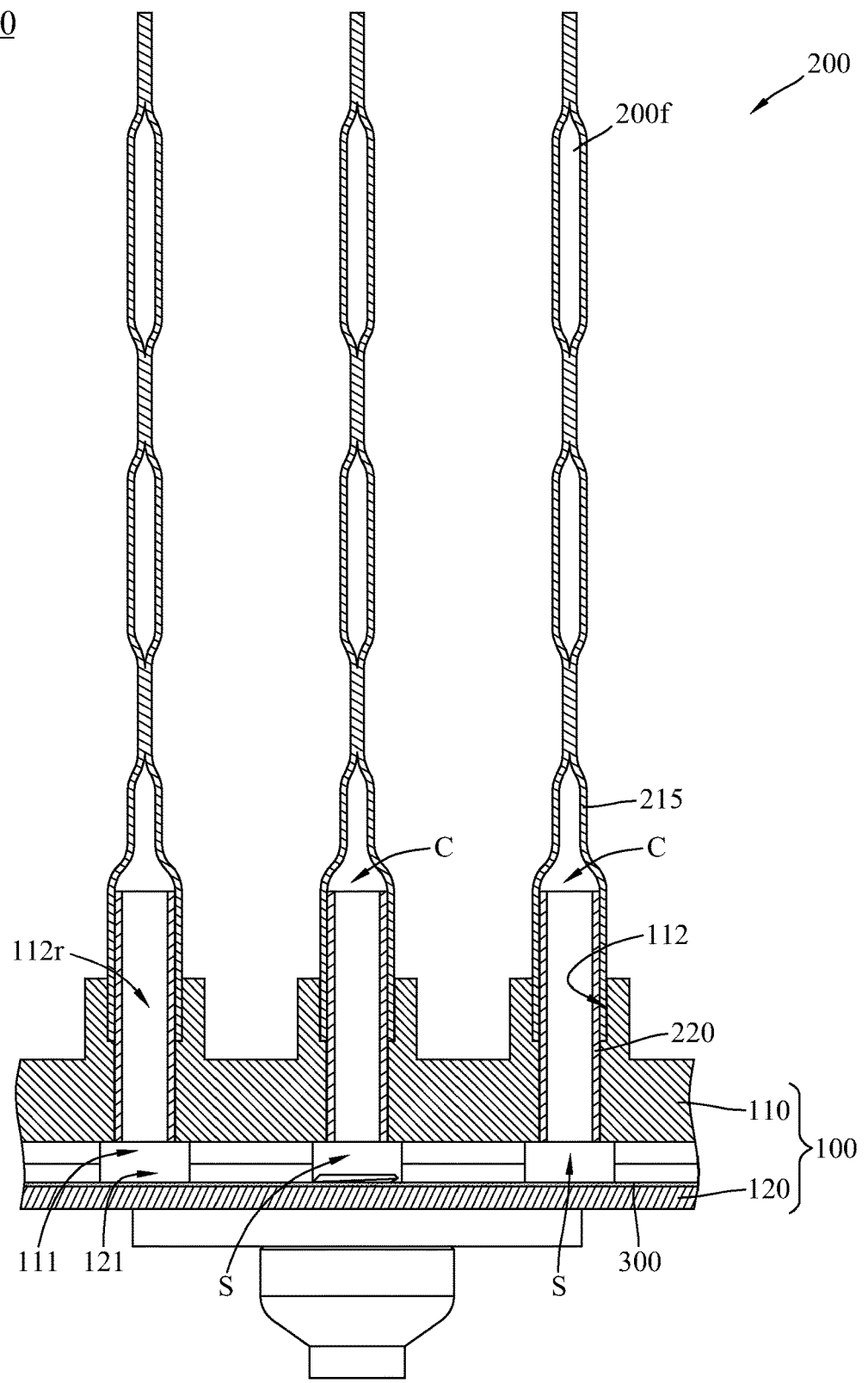
FIG. 4 is schematic partial cross-sectional view of a vapor chamber heatsink assembly, according to an example embodiment.
Figure 5:
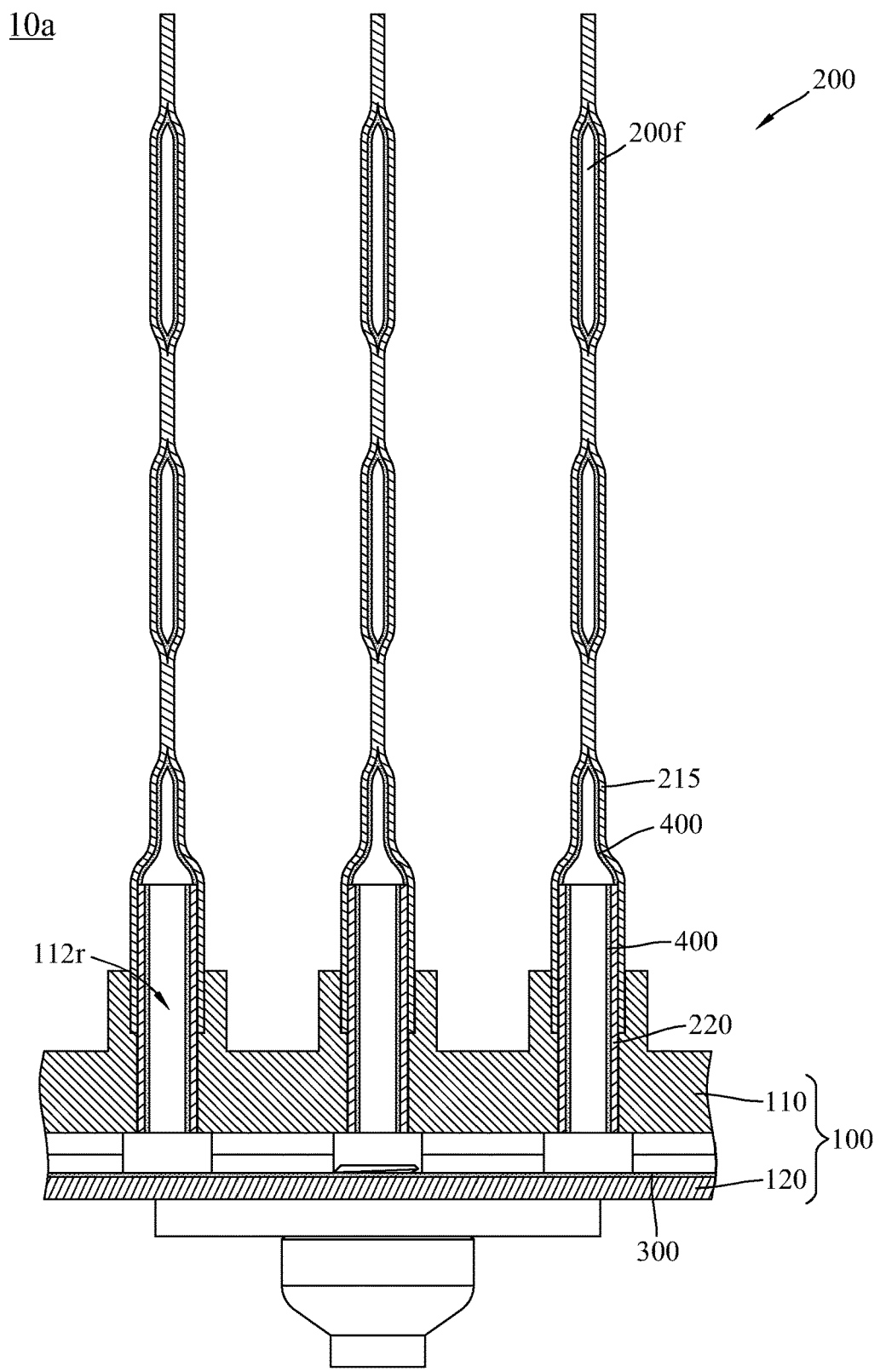
FIG. 5 is schematic partial cross-sectional view of an alternative vapor chamber heatsink assembly, according to an example embodiment.
Figure 6:
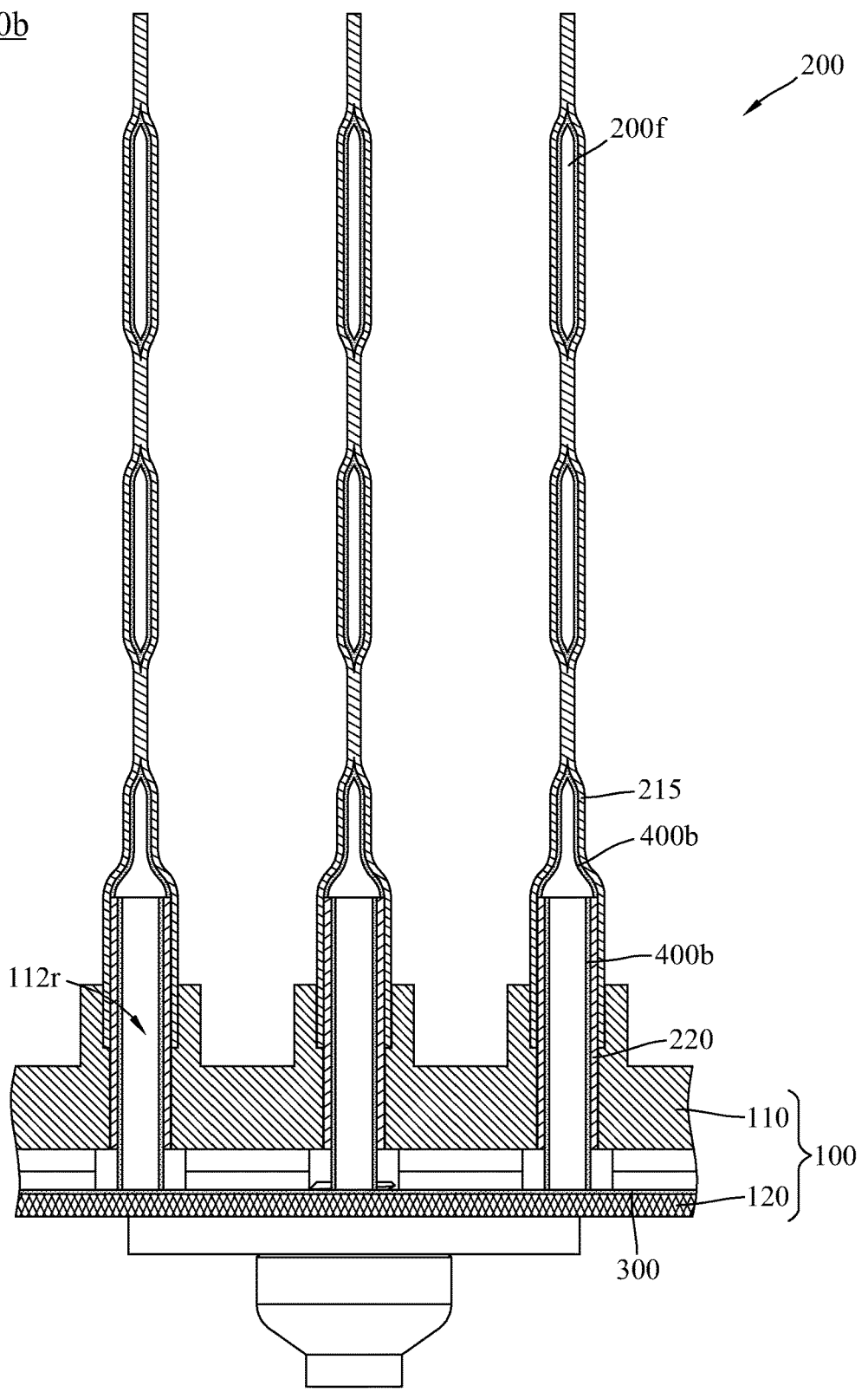
FIG. 6 is schematic partial cross-sectional view of another alternative vapor chamber heatsink assembly, according to an example embodiment.

In some embodiments, a wick structure may be disposed within the vapor chamber heatsink assembly 10, 10c, 10d. FIG. 4 is schematic partial cross-sectional view of a vapor chamber heatsink assembly, according to an example embodiment. Referring to FIG. 4, and referring to FIGS. 1A to 1C, in an embodiment, a side of each of the plurality of vapor braided channels 111 and 121, S opposite the contact surface of the lower chamber surface comprises a wick structure thereon, respectively. FIG. 5 is schematic partial cross-sectional view of an alternative vapor chamber heatsink assembly, according to an example embodiment. Referring to FIG. 5, and referring to FIGS. 1A to 1C, in an alternative embodiments, a side of each of the plurality of fin braided channels 210f, C opposite an outside surface of the plurality of heatsink fins 200 comprises a wick structure thereon, respectively. However, the embodiments are not limited thereto. FIG. 6 is schematic partial cross-sectional view of another alternative vapor chamber heatsink assembly, according to an example embodiment. Referring to FIG. 6, and referring to FIGS. 1A to 1C, in another alternative embodiment, the wick structures of the plurality of fin braided channels 210f, C may extend to contact the wick structures of the plurality of vapor braided channels 111 and 121, S.

The wick structure may be used to facilitate the flow of condensed fluid by capillary force back to the evaporation surface, keeping the evaporation surface wet for large heat fluxes. In some embodiments, the wick structure comprises at least one of a porous polymer wick structure, micro groove wick structure, metal mesh wick structure, sintered powder wick structure or sintered ceramic powder wick structure, or any combination of the foregoing.

The dimensions, depth, and amount of each of the plurality of mounting tracks 112 correspond to the dimensions, height and amount of each fin base 215 of each of the plurality of heatsink fins 200.

In some embodiments, each of the plurality of heatsink fins 200 is thermally and mechanically, permanently mounted to the upper casing 110 at the plurality of mounting tracks 112 via brazing techniques known to those of ordinary skill in the relevant art; however, the embodiments are not limited thereto. Other appropriate methods may be employed, as long as heat may be efficiently and effectively transferred from the vapor chamber 100 to the plurality of heatsink fins 200, the vapor chamber heatsink assembly 10 may be vacuum sealed, and the working fluid may travel through the plurality of vapor braided channels 111 and 121, S and the plurality of fin braided channels 210f, C unobstructed.

As an example, 'obstructed manner' of the plurality of braided channels may comprise 45° degree or smaller sharp turn angles within the plurality of braided channel paths. As an example, a 'path' of the plurality of braided channels may comprise a generally same direction prior to and after any adjustment in direction.

Any technique known to those of ordinary skill in the relevant art may be employed for the manufacturing of the vapor chamber 100 and each of the plurality of heatsink fins 200 and the embodiments are not limited. In some embodiments, an inflation process is used to form the plurality of vapor braided channels 111 and 121, S of the vapor chamber 100 and/or the plurality of fin braided channels 210f, C of each of the plurality of heatsink fins 200. In some embodiments, if a process other than an inflation process is used to form the vapor chamber 100 and/or each of the plurality of heatsink fins 200, such as a process comprising lost-foam casting, any bonding method known by those skilled in the relevant art, such as ultrasonic welding, diffusion welding, laser welding and the like, can be employed to bond and integrally form the vapor chamber 100 and each of the plurality of heatsink fins 200; as long as a vacuum seal can be achieved.

In some embodiments, the working fluid is made of acetone; however, the embodiments are not limited thereto. Other working fluids can be employed, as can be common for those skilled in the relevant art. As a non-limiting example, the working fluid can comprise cyclopentane or n-hexane. As long as the working fluid can be vaporized by a heat source and the vapor can condense back to the working fluid and flow back to the heat source.

Generally, the thermal performance of a plurality of heat sink fins is dependent on the effectiveness to transfer heat. Thus, shape, thickness, material, and enhancements of the plurality of fins all contribute to the thermal performance thereof. An increase in the amount of the plurality of fins for a given attachment area increases surface area, but, may hinder the average amount of heat transferred from each square centimeter of the surface area by restricting airflow. Also, an increase in the height of the fins for a given attachment area also increases surface area, but, may decrease fin efficiency and increase mass, weight and costs. Increasing the amount and size of the plurality of fins may increase surface area, but contrarily, decrease overall thermal performance. This is further exacerbated when only natural convection is available.

Furthermore, for vaper chambers to effectively spread heat via the phase change (liquid-vapor-liquid) mechanism, the area of the cooling surfaces should be larger than the heat flux source interface surfaces, the design of the vapor chambers should hinder deformation and leakage and heat-transmitting efficiency of the vapor chamber should be at a highest. This becomes more difficult to accomplish as the amount of heat flux source interfaces, having a distance therebetween, increase; thus, requiring the dimensions of the vapor chamber to increase. As the dimensions of the vapor chamber increases, so does the dimensions of the plurality of heatsink fins and correspondingly, the weight on the surface of the vapor chamber. Additionally, when there is more than one heat flux source interface, leakage and dry-out occurs, when the temperature of one of the heat flux sources is greater than the temperature of another heat flux source, causing the working fluid to agglomerate closer to the heat flux source with the higher temperature. Thus, dry-out occurs near the lower temperature heat flux source interface, causing the corresponding electric and/or electronic elements, devices and/or systems to overheat, fail or become damaged.

A vapor chamber heatsink assembly, under vacuum, having a working fluid therein, comprising a plurality of heatsink fins and a vapor chamber is provided. The vapor chamber and the plurality of heatsink fins each comprise a plurality of obstructers defining a plurality of braided channels therein. Thus, the condenser regions of the vapor chamber are expanded to the plurality of heatsink fins. When heat from a greater temperature heat source and a lower temperature heat source is applied to the vapor chamber, via the plurality of obstructers and braided channels, the working fluid and liquid vapor travel therethrough, providing an effective phase change mechanism to the greater temperature heat source, while concurrently, hindering agglomeration of working fluid thereto. An effective phase change mechanism is also concurrently provided to the lower temperature heat source due to the non-agglomeration of working fluid to the greater temperature heat source.

In the embodiments, the plurality of vapor braided channels comprises evaporator regions, condenser regions and vapor flow regions extending from the evaporator regions to the condenser regions. The condenser regions of the vapor chamber are further expanded to the plurality of fin braided channels of the plurality of heatsink fins via the at least two connection channels. When heat from a first heat source, requiring less power and operating temperature than a second heat source, along with heat from the second heat source is applied to respective contact surface portions of the lower casing, the heat converts the working fluid to vapor and the vapor bubbles become larger within the respective evaporator regions. Via the plurality of vapor obstructers, plurality of vapor braided channels, plurality of fin obstructers, and plurality of fin braided channels, the working fluid and liquid vapor slugs/bubbles travel through the plurality of vapor braided channels and plurality of fin braided channels, providing an effective phase change (liquid-vapor-liquid) mechanism to the greater power and operating temperature second heat source, in at least two opposing plurality of vapor braided channels directions, while concurrently, hindering agglomeration of the working fluid thereto. Thus, an effective phase change (liquid-vapor-liquid) mechanism to the lesser power and operating temperature first heat source is concurrently provided, in at least two opposing directions of the plurality of vapor braided channels directions, mitigating dry-out from occurring which may cause corresponding electric and/or electronic elements, devices and/or systems to overheat, fail or be damaged. Meanwhile, at the condenser regions, the plurality of airflow through holes force airflow to flow from a second direction perpendicular to the airflow flowing across the surfaces between each neighboring heat exchanger fin from a first direction, agitating airflow, creating turbulent airflow, thus, eliminating dead air between each heat exchanger fin. By eliminating dead air via the plurality of airflow through holes, the distance between the plurality of heat exchanger fins may be minimized without sacrificing the average amount of heat transferred from each square centimeter of surface area of the plurality of heat exchanger fins, even when only natural convection is available. Thus, heat is being effectively removed and the bubbles are reducing in size, providing an effective phase change (liquid-vapor-liquid) mechanism.

Additionally, via the plurality of vapor obstructers and plurality of fin obstructers, the working fluid and liquid vapor slugs/bubbles travel through the plurality of vapor braided channels and plurality of fin braided channels, whereby the amount of working fluid for efficient and effective thermal performance of vapor chamber heatsink assemblies of the embodiments is reduced when compared to vapor chamber heatsink assemblies that do not comprise the plurality of vapor obstructers, plurality of vapor braided channels, plurality of fin obstructers, and plurality of fin braided channels. Furthermore, the staggered pitch of the plurality of airflow through holes increases the creation of non-equilibrium pressure conditions within the plurality of fin braided channels, strengthening the self-sustaining turbulent driving forces therein. Thus, with less working fluid and decreased mass due to the plurality of airflow through holes, weight of the vapor chamber heatsink assembly is reduced.

Furthermore, via the dimensions of the plurality of vapor obstructers in relation to the plurality of vapor braided channels, the mounting surface of the upper casing may withstand a heavier weight thereon, decreasing the probability of deformation and/or collapsing of the vapor chamber heatsink assembly, which would result in leakage of the working fluid and eventual dry-out. Thus, manufacturing of larger sized vapor chamber heatsink assemblies having a greater amount of plurality of heatsink fins thereon is facilitated for efficient and effective thermal performance of electric and/or electronic elements, devices and/or systems.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or includes ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112f unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A vapor chamber heatsink assembly, under vacuum, having a working fluid therein, comprising:
   a plurality of heatsink fins, each, having a first metal sheet connected to a second metal sheet defining a fin tip, a fin base opposite the fin tip and an enhancement portion between the fin tip and fin base,
      wherein the enhancement portion has a plurality of airflow through holes therethrough, and
      wherein the plurality of airflow through holes define a plurality of fin obstructers forming a plurality of fin braided channels therearound in direct or indirect communication thereamong, and the fin base has at least two connection channels extending therethrough, the at least two connection channels in direct or indirect communication with the plurality of fin braided channels; and
   a vapor chamber having:
      an upper casing comprising:
         a mounting surface having a plurality of mounting tracks extending therefrom, each having at least two receiving channels therethrough; and
         an upper chamber surface, opposite the mounting surface, and
      a lower casing comprising:
         a lower chamber surface; and
         a contact surface, opposite the lower chamber surface,
      wherein the upper and lower chamber surfaces form a plurality of vapor obstructers defining a plurality of vapor braided channels therearound in direct or indirect communication thereamong,
      wherein a shape of each of the plurality of vapor obstructers is an oblong shape, and each of the plurality of vapor obstructers is parallel thereamong and separated by the plurality of vapor braided channels, whereby a length of each of the plurality of vapor obstructers is a same length and along a same direction as a length of each of the plurality of mounting tracks,
   wherein the fin base and each of the at least two connection channels are mounted to the plurality of mounting tracks and at least two receiving channels, respectively,
   wherein the first metal sheet is tightly connected to the second metal sheet, the upper chamber surface is tightly connected to the lower chamber surface, and the plurality of heatsink fins is liquid tight connected to the vapor chamber,
   whereby at least an entire perimeter wall of each fin obstructer of the plurality of fin obstructers is opposingly comprised of the plurality of fin braided channels, and the working fluid travels through the plurality of vapor braided channels and the plurality of fin braided channels unobstructed.

2. The vapor chamber heat assembly of claim 1, further comprising:
   a first heat source; and
   a second heat source,
   wherein the first and second heat sources are mounted to the contact surface of the lower casing, and at least one of the plurality of vapor obstructers of the upper and lower chamber surfaces is between the first and second heat sources.

3. The vapor chamber heat assembly of claim 2, further comprising at least an additional heat source, wherein the at least an additional heat source is mounted to the contact surface of the lower casing.

4. The vapor chamber heat assembly of claim 2, wherein the power requirement and maximum operating temperature allowance of the first heat source is less than the power requirement and maximum operating temperature allowance of the second heat source, whereby, during operation, the working fluid travels through the plurality of vapor braided channels, at least two connection channels, and the plurality of fin braided channels, respectively, while concurrently, being hindered to agglomerate to the second heat source via the at least one of the plurality of vapor obstructers therebetween.

5. The vapor chamber heat assembly of claim 1, wherein the amount of the plurality of vapor obstructers is between five and thirty, inclusive.

6. The vapor chamber heat assembly of claim 1, wherein the amount of the plurality of vapor obstructers is greater than thirty.

7. The vapor chamber heat assembly of claim 1, wherein a shape of the at least an entire perimeter wall of each of the plurality of fin obstructers is curved, and each is separated by the plurality of fin braided channels.

8. The vapor chamber heat assembly of claim 1, wherein a pitch of the plurality of airflow through holes defining the plurality of fin obstructers is a staggered pitch, and each is separated by the plurality of fin braided channels.

9. The vapor chamber heat assembly of claim 1, wherein an amount of the plurality of airflow through holes defining the plurality of fin obstructers is between one to eighty, inclusive.

10. The vapor chamber heat assembly of claim 1, wherein an amount of the plurality of airflow through holes defining the plurality of fin obstructers is greater than eighty.

11. The vapor chamber heat assembly of claim 1, wherein a side of each of the plurality of vapor braided channels opposite the contact surface of the lower chamber surface, a side of each of the plurality of fin braided channels opposite an outside surface of the plurality of heatsink fins, and a side of each of the at least two connection channels comprise a wick structure thereon, respectively, whereby the wick structure of the side of each of the plurality of vapor braided channels extend to the wick structure of the side of each of the plurality of fin braided channels via the side of each of the at least two connection channels.

12. The vapor chamber heat assembly of claim 11, wherein the wick structure comprises at least one of a porous polymer wick structure, micro groove wick structure, metal mesh wick structure, sintered powder wick structure or sintered ceramic powder wick structure, or any combination of the foregoing.

13. The vapor chamber heat assembly of claim 1, wherein each of the plurality of heatsink fins is mounted to the upper casing at the plurality of mounting tracks via brazing, respectively.

14. The vapor chamber heat assembly of claim 1, wherein the plurality of fin braided channels is formed by inflating.

* * * * *